US005711838A

United States Patent [19]
Pankoke

[11] Patent Number: 5,711,838
[45] Date of Patent: Jan. 27, 1998

[54] METHOD OF AND DEVICE FOR CONTINUOUSLY OR DISCONTINUOUSLY MANUFACTURING FLAT SHEETS OF MULTIPLE-LAYER MATERIALS, LAMINATES OR SIMILAR ARTICLES

[75] Inventor: Werner Pankoke, Bielefeld, Germany

[73] Assignee: Firma Theodor Hymmen, Bielefeld, Germany

[21] Appl. No.: 961,046

[22] Filed: Oct. 14, 1992

Related U.S. Application Data

[63] Continuation of Ser. No. 725,841, Jul. 3, 1991, abandoned.

[30] Foreign Application Priority Data

Jul. 4, 1990 [DE] Germany .................. 40 21 341.2

[51] Int. Cl.$^6$ ...................................... B32B 31/00
[52] U.S. Cl. .................. 156/272.8; 156/88; 156/251; 156/267; 156/380.9; 156/308.4; 156/583.4; 100/38; 100/39; 100/92; 100/94; 219/121.68; 219/121.69
[58] Field of Search .................. 156/88, 272.8, 156/251, 267, 380.9, 290, 308.4, 583.4, 324, 258, 270, 271, 307.1, 307.7; 100/39, 38, 92, 94, 95–97; 219/121.68, 121.69

[56] References Cited

U.S. PATENT DOCUMENTS

| | | | |
|---|---|---|---|
| 3,456,355 | 7/1969 | Cumming et al. | 156/380.9 |
| 3,560,291 | 2/1971 | Foglia et al. | 156/272.8 X |
| 3,867,153 | 2/1975 | MadLachlan | 156/272 Z |
| 3,933,555 | 1/1976 | Downey | 156/251 X |
| 4,029,535 | 6/1977 | Cannon et al. | 156/272.8 |
| 4,420,359 | 12/1983 | Goldsworthy | 156/583.5 X |
| 4,430,070 | 2/1984 | Ausnit | 493/215 |
| 4,490,203 | 12/1984 | Bose | 156/251 |
| 4,500,382 | 2/1985 | Foster | 156/251 X |
| 4,539,059 | 9/1985 | Burger et al. | 156/251 |
| 4,540,392 | 9/1985 | Junod et al. | 156/272.8 X |
| 4,573,404 | 3/1986 | Held | 100/93 RP |
| 4,579,612 | 4/1986 | Held | 156/324 |
| 4,738,752 | 4/1988 | Busker et al. | 100/93 RP |
| 4,903,400 | 2/1990 | Pankoke | 72/184 X |

FOREIGN PATENT DOCUMENTS

| | | | |
|---|---|---|---|
| 3347877 A1 | 7/1985 | Germany . | |
| 62-062734 | 3/1987 | Japan | 156/272.8 |

*Primary Examiner*—David A. Simmons
*Assistant Examiner*—Paul M. Rivard
*Attorney, Agent, or Firm*—Sprung Kramer Schaefer & Briscoe

[57] ABSTRACT

A method and device for continuously or discontinuously manufacturing flat sheets of multiple-layer materials, laminates, or similar articles for use in the furniture and electrical industries. In order to prevent molten resin from leaking out at the edges of layer of material while they are being bonded under heat and pressure, the free edges of the stacked layers of bonding material are welded together before the material is transformed into a composite sheet or composite web by heat and pressure.

4 Claims, 1 Drawing Sheet

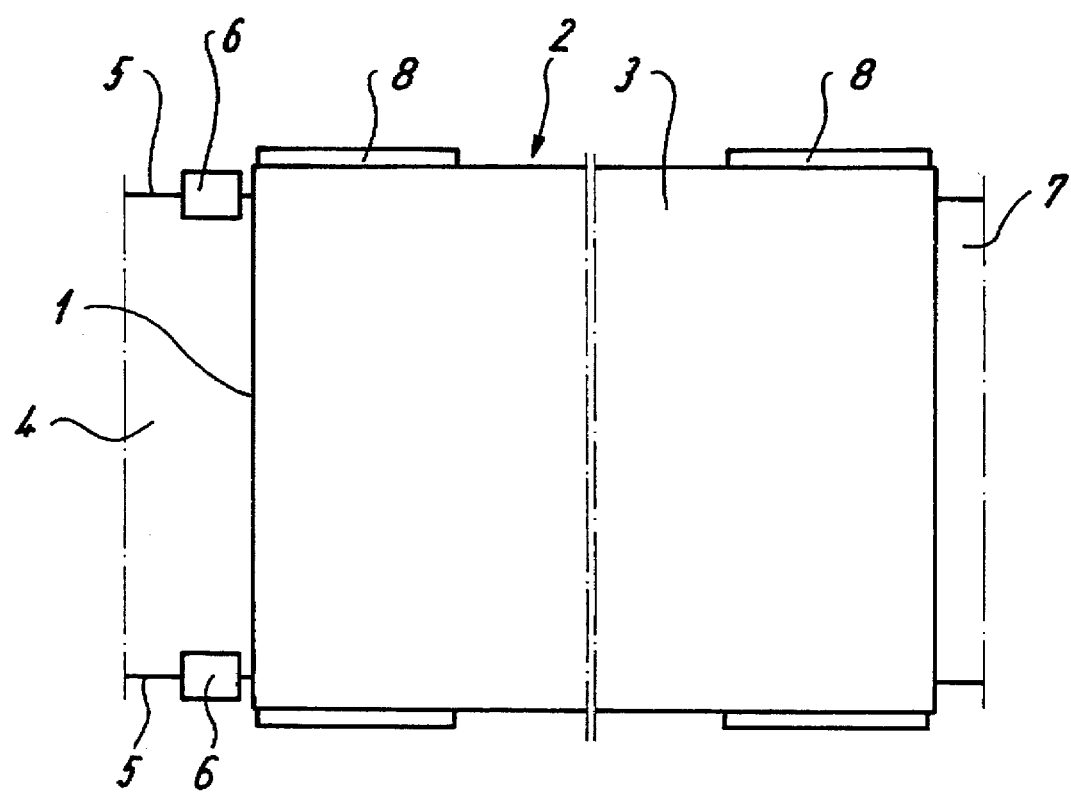

METHOD OF AND DEVICE FOR CONTINUOUSLY OR DISCONTINUOUSLY MANUFACTURING FLAT SHEETS OF MULTIPLE-LAYER MATERIALS, LAMINATES OR SIMILAR ARTICLES

This application is a continuation of application Ser. No. 07/725,841, filed Jul. 3, 1991, now abandoned.

BACKGROUND OF THE INVENTION

The invention concerns a method of and a device for continuously or discontinuously manufacturing flat sheets of multiple-layer materials, laminates, or similar articles, whereby layers of bonding material are liquified by pressure and heat and hardened.

A continuous-operation press with an upper belt and a lower belt, each belt traveling around a pair of deflection rollers, is known from German Patent 3 347 877. A web of materials—laminates, electrolaminates, thin sheets of chip board, fiber board, or plywood, and similar materials—can be compacted subject to pressure between the facing strands of belt. The opposing edges of the facing belts in this two-belt press are grooved. Each groove accommodates a wire that is approximately as thick as the sum of the depths of the two grooves and the distance between the belts.

The operating section of the press is demarcated at the top and bottom by the belts, downstream by hardened resin and upstream by unmelted resin. The wires extend through this section, separated from the longitudinal edges of the stack of bonding-material layers, allowing molten resin to escape at each edge and to completely occupy the spaces between the edges and the wires. This situation makes it difficult to keep the thickness of the material uniform at its edges.

The known embodiment does not guarantee a liquid-tight seal between the belts and the wires that to some extent engage the grooves, and molten resin will not only escape from the bonding material into the space between the material and the wire but can also be forced out through a gap between the wire and the belts. This situation also makes it difficult to keep the thickness of the material uniform at its edges.

Furthermore, not only must each belt in the known two-belt press have a groove, but the wires must be adapted to the thickness of each type of bonding material.

SUMMARY OF THE INVENTION

One object of the present invention is a method of the aforesaid type wherein no molten phase will escape from the bonding material while the layers are being pressed together.

This object is attained in accordance with the invention in that the free edges of the stacked layers of bonding material are welded together before the material is transformed into a composite sheet or composite web by heat and pressure.

The edges can be welded together by laser beams. The laser beams in one practical embodiment of the method in accordance with the invention trim the edges of the material to match while they are welding them together.

In a device for carrying out the method of continuously manufacturing flat sheets of multiple-layer materials, laminates, or similar articles with a belted press, preferably a press with two belts, the laser is positioned just upstream of where the layers of bonding material enter the pressure section, and the beams it generates weld the stacked free longitudinal edges together as the edges travel along with the material.

The method and device in accordance with the invention accordingly require no lateral-demarcation components to laterally seal the pressure section produced by the strands of the belts and needing to be reset when a material of different thickness is to be processed.

Welding the free sides of the layers of bonding material together before pressure is applied in the operating section will ensure uniform conditions in that section throughout the material, which is a prerequisite for maintaining strict tolerance in the final product. There is no need to seam the web of material once it leaves the press's operating section.

BRIEF DESCRIPTION OF THE DRAWING

The FIGURE is a top view of the essential components of a two-belt press for carrying out the method in accordance with the invention.

DETAILED DESCRIPTION OF THE INVENTION

Several webs 4 provided with a system of thermoplastic resins are supplied to the intake 1 of a press 2 with two continuous driven pressure-application belts 3. The webs arrive in the press's operating section and are subjected to heat and pressure.

In the vicinity of intake 1 a single laser 6 is associated with the superimposed and aligned longitudinal edges 5 of webs 4 on each side. The laser's beams weld the edges together, preventing resin from escaping in the vicinity of the edges as the material travels through the operating section.

The laser beams can also seam the edges of webs 4. The finished composite web 7 is conveyed out of the operating section and further processed.

Belts 3 travel around cylinders 8 and convey the material to the exit.

What is claimed is:

1. In a method of continuously manufacturing flat sheets of multiple-layer materials or laminates, wherein stacked layers of bonding material having edges are liquified by pressure and heat in a reaction zone of a double-belt press, the improvement comprising: welding only free edges of the stacked layers of bonding material together upstream of the reaction zone by laser beams and before transforming the material into a composite sheet or composite web by heat and pressure in the reaction zone.

2. The method as in claim 1, wherein the laser beams trim the edges of the material to match while welding the edges together.

3. A device for continuously manufacturing flat sheets of multiple-layer materials or laminates, comprising a double-belted press having a reaction zone receptive of stacked layers of bonding material for applying heat and pressure and wherein the stacked layers have longitudinal edges, laser means positioned just upstream of the reaction zone for producing a beam to weld only free longitudinal edges of the stacked layers together before the material is subjected to heat and pressure.

4. The device as in claim 3, wherein the laser means has means for trimming the edges of the material to match while welding the edges together.

* * * * *